US011202389B2

(12) United States Patent
Chen et al.

(10) Patent No.: US 11,202,389 B2
(45) Date of Patent: Dec. 14, 2021

(54) HEAT DISSIPATION STRUCTURE AND ELECTRONIC DEVICE

(71) Applicant: TRIPLE WIN TECHNOLOGY(SHENZHEN) CO.LTD., Shenzhen (CN)

(72) Inventors: Shin-Wen Chen, New Taipei (TW); Jing-Wei Li, Guangdong (CN); Jian-Chao Song, Guangdong (CN); Sheng-Jie Ding, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/711,734

(22) Filed: Dec. 12, 2019

(65) Prior Publication Data

US 2021/0127527 A1 Apr. 29, 2021

(30) Foreign Application Priority Data

Oct. 28, 2019 (CN) .......................... 201911030538.6

(51) Int. Cl.
*H05K 7/20* (2006.01)
*F28D 15/04* (2006.01)
*G03B 17/55* (2021.01)

(52) U.S. Cl.
CPC ....... *H05K 7/20336* (2013.01); *F28D 15/043* (2013.01); *G03B 17/55* (2013.01); *H05K 7/20309* (2013.01); *H05K 7/20318* (2013.01); *H05K 7/20327* (2013.01)

(58) Field of Classification Search
CPC .. F28D 15/0266; F28D 15/02; F28D 15/0233; F28D 15/0275; F28D 15/046; F28D 15/04; F28D 15/043; H01L 23/427; H01L 23/473; F28F 3/12; F28F 2215/06; H05K 7/20336; H05K 7/20809; H05K 7/2029; H05K 7/20309; G06F 1/20; G06F 1/206; G06F 2200/201
USPC .......... 361/700, 701, 679.53, 688, 689, 699, 361/702, 761; 165/104.21, 104.26, 165/104.22, 104.11, 104.33, 274, 80.4; 257/714, E23.088, 715, 720
See application file for complete search history.

(56) References Cited

U.S. PATENT DOCUMENTS

| | | | |
|---|---|---|---|
| 2002/0092166 A1* | 7/2002 | Jacobs | F28D 15/0233 29/890.032 |
| 2008/0218980 A1* | 9/2008 | Tracewell | H05K 7/20672 361/713 |
| 2009/0021908 A1* | 1/2009 | Patel | G06F 1/20 361/688 |

(Continued)

*Primary Examiner* — Mandeep S Buttar
(74) *Attorney, Agent, or Firm* — ScienBiziP, P.C.

(57) ABSTRACT

A heat dissipation structure mounted in an electronic device includes a base body defining a seal chamber, a heat transfer medium in the seal chamber, and a connecting element. The seal chamber includes interconnected evaporation and condensation portions. The connecting element is coupled to the evaporation portion and a camera module of the electronic device. Heat generated by the camera module is transferred to the evaporation portion via the connecting element, the heat transfer medium turns to gas, and the gas flows into the condensation portion and condenses, dissipating the heat to the outside of the electronic device. The disclosure further provides an electronic device using the heat dissipation structure.

4 Claims, 3 Drawing Sheets

(56) References Cited

U.S. PATENT DOCUMENTS

| | | | | |
|---|---|---|---|---|
| 2014/0160679 A1* | 6/2014 | Kelty | .................... | G02B 6/4269 361/700 |
| 2014/0168896 A1* | 6/2014 | Fujiwara | ............ | H05K 7/20445 361/697 |
| 2014/0254095 A1* | 9/2014 | Horng | ................ | H05K 7/20154 361/692 |
| 2019/0293356 A1* | 9/2019 | Tian | ...................... | F25B 39/022 |

* cited by examiner

HEAT DISSIPATION STRUCTURE AND ELECTRONIC DEVICE

FIELD

The subject matter herein generally relates to temperature control and heat dissipation devices.

BACKGROUND

A camera module of a cell phone includes a carrier, an image sensor, and a circuit board. A sealed space is created by the carrier and the circuit board, the image sensor is received in the space. The build-up of heat in the sealed space during working can deform the image sensor. Thus, the imaging quality of the lens module is lowered.

BRIEF DESCRIPTION OF THE DRAWINGS

Implementations of the present technology will now be described, by way of embodiment, with reference to the attached figures.

DETAILED DESCRIPTION

Figure 1:
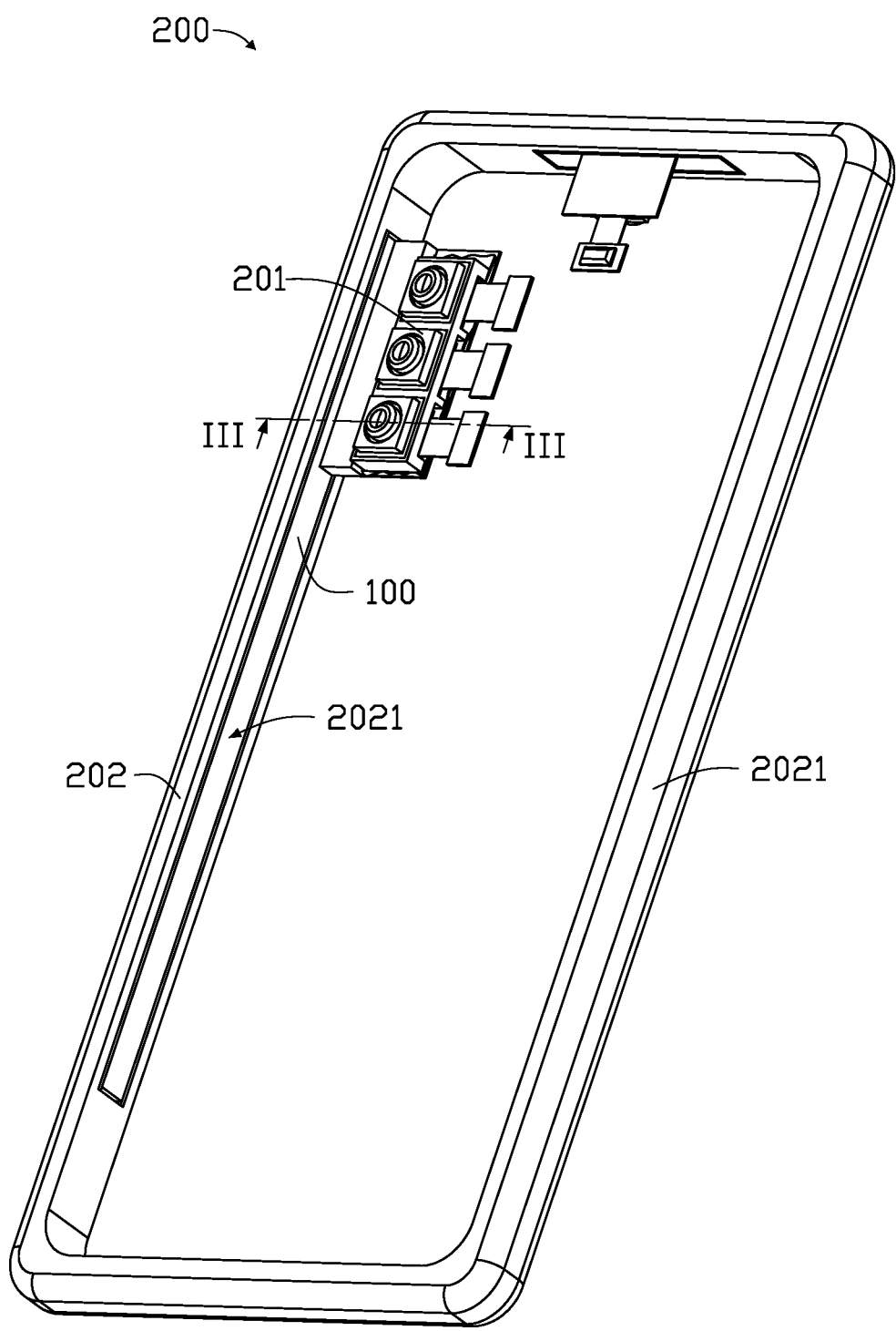
FIG. 1 is an isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
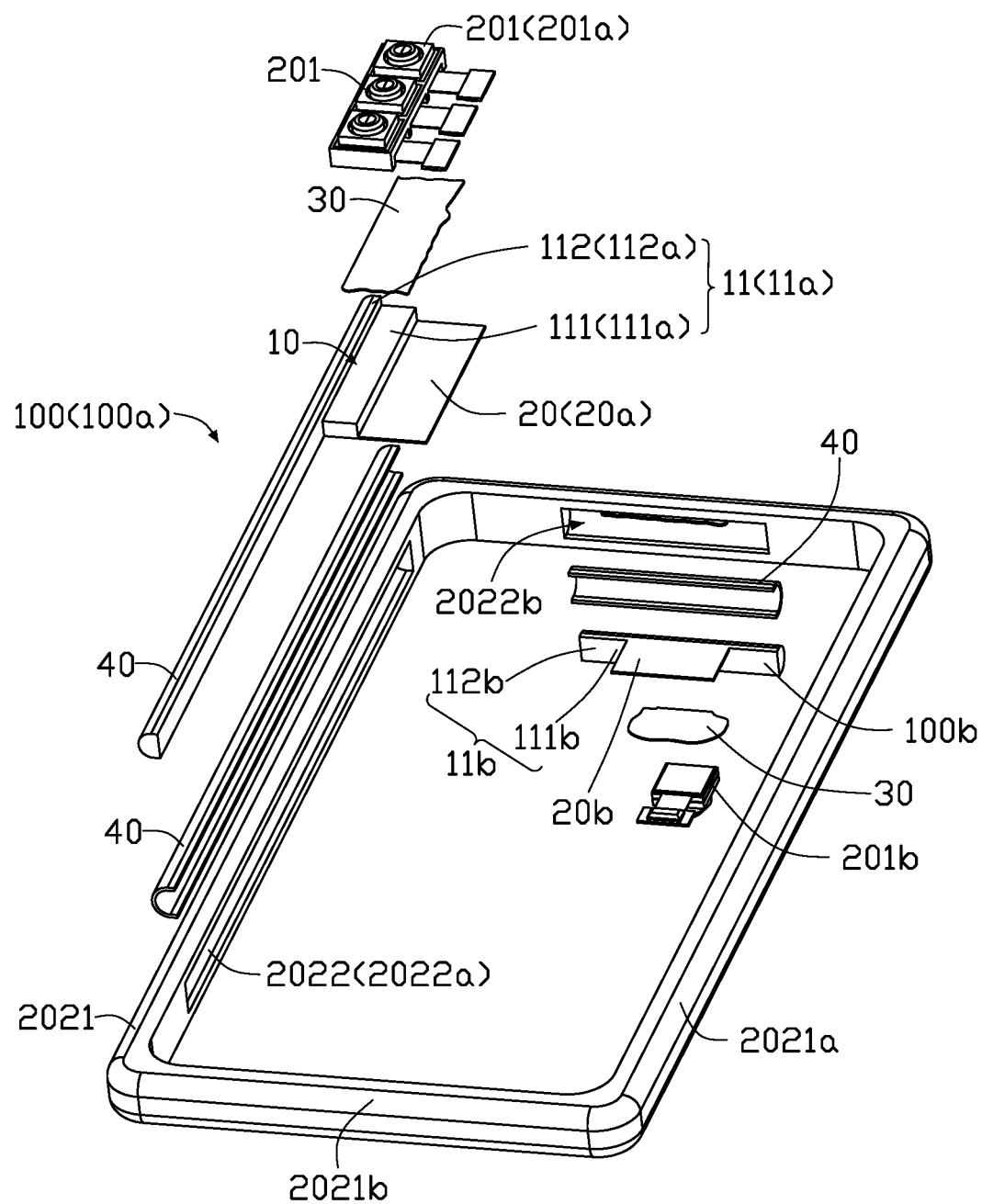
FIG. 2 is an exploded, isometric view of the electronic device of FIG. 1.
Figure 3:
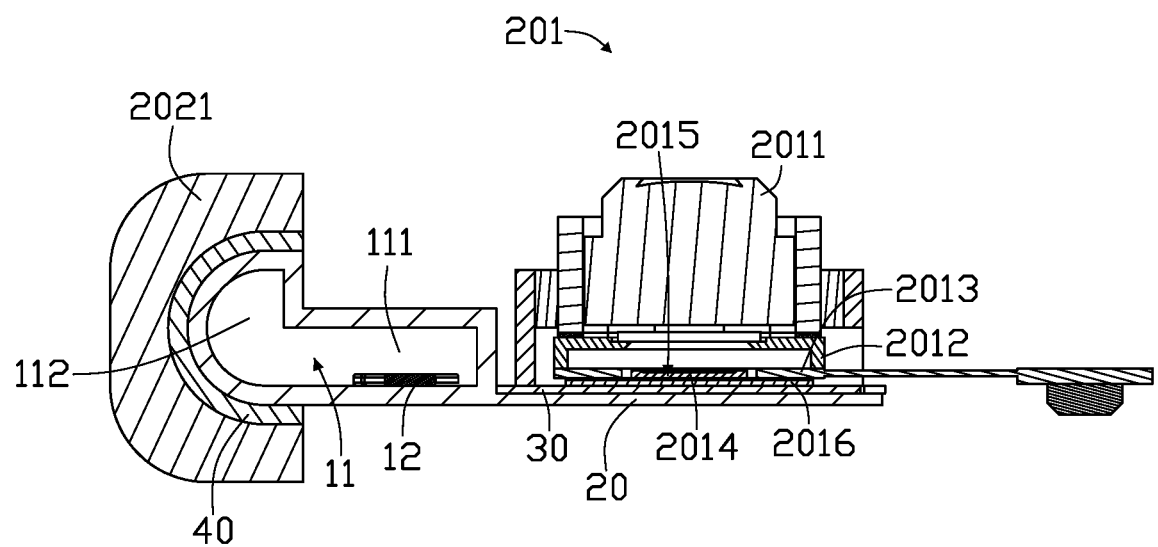
FIG. 3 is a cross-sectional view taken along line III-III of FIG. 1.

FIGS. 1-3 illustrate an embodiment of a heat dissipation structure 100 which is arranged in an electronic device 200. The electronic device 200 includes a heating element. In one embodiment, the heating element is a camera module 201.

The heat dissipation structure 100 includes a base body 10, a seal chamber 11 defined in the base body 10, and a heat transfer medium 12 sealed in the seal chamber 11. The seal chamber 11 includes an evaporation portion 111 and a condensation portion 112 communicating with the evaporation portion 111. The heat dissipation structure 100 further includes a connecting element 20 connected to the evaporation portion 111. The camera module 201 is fixed on the connecting element 20. Heat generated by the camera module 201 is transferred to the connecting element 20, and then is transferred to the evaporation portion 111. The heat transfer medium 12 in the evaporation portion 111 becomes gaseous as it absorbs heat. The gaseous heat transfer medium 12 flows into the condensation portion 112 and condenses to dissipate the heat to the exterior of the electronic device 200.

The heat dissipation structure 100 is connected to the camera module 201 via the connecting element 20, thus heat generated by the camera module 201 can be quickly carried away. Heat distortion of an image sensor of the camera module 201 is avoided, an image quality of the camera module 201 is improved.

In one embodiment, material of the heat dissipation structure 100 is metal, such as, copper, iron, silver, and gold, etc.

In one embodiment, the base body 10 carries a capillary structure (not shown) on the inner wall. The capillary structure is made of material which is porous because of very small-scale passages (capillary) in the final form of the material. The capillary structure is formed by sintering copper powders, being particles of different shapes. In an alternative embodiment, the capillary structure can be formed by other methods, for example, by fibers, silk nets, or grooves.

The evaporation portion 111 is substantially rectangular. The condensation portion 112 is substantially strip shaped, and a cross section of the condensation portion 112 is substantially semicircular. In an alternative embodiment, shapes of the evaporation portion 111 and the condensation portion 112 can be changed according to needs.

In one embodiment, the heat dissipation structure 100 is formed by an in-mold forming process. In an alternative embodiment, the heat dissipation structure 100 can be formed during other forming processes.

In one embodiment, the heat transfer medium 12 is a liquid with a low boiling point which is very volatile, and is also not corrosive in the heat dissipation structure. Such liquid may thus be pure water, methanol, or ethanol, and the heat transfer medium 12 can be injected into the heat dissipation structure 100 during the in-mold forming process.

The camera module 201 includes an optical lens 2011, a carrier 2012 connected to the optical lens 2011, a circuit board 2013 connected to the carrier 2012, and an image sensor 204 electrically connected to the circuit board 2013. The circuit board 2013 defines a hollow area 2015 corresponding in position to the optical lens 2011. The image sensor 2014 is received in the hollow area 2015. The image sensor 2014 carries a steel plate 2016 on a side away from the optical lens 2011. The steel plate 2016 is connected to the connecting element 20 via a first heat conducting adhesive layer 30.

In one embodiment, the electronic device 200 includes at least one first heating element (e.g. rear-facing camera 201a), a first heat dissipation structure 100a connected to the first heating element, at least one second heating element (e.g. front-facing camera 201b), and a second heat dissipation structure 100b connected to the second heating element.

The first heating dissipation structure 100a includes a first base body 10a, a first seal chamber 11a defined in the first base body 10a, and a heat transfer medium 12 sealed in the first seal chamber 11a. The first seal chamber 11a includes a first evaporation portion 111a and a first condensation portion 112a communicating with the first evaporation portion 111a. The first heat dissipation structure 100a further includes a first connecting element 20a connected to the first evaporation portion 111a. The rear-facing camera 201a is in contact with the first connecting element 20a. Heat generated by the rear-facing camera 201a is transferred to the first connecting element 20a, and then is transferred to the first evaporation portion 111a. The heat transfer medium 12 in the first evaporation portion 111a absorbs heat and becomes gaseous. In gas form, the heat transfer medium 12 flows into the first condensation portion 112a and condenses, so dissipating heat carried by the heat transfer medium 12 out of the electronic device 200 via the first condensation portion 112a.

The second heating dissipation structure 100b includes a second base body 10b, a second seal chamber 11b defined in the second base body 10b, and a heat transfer medium 12 sealed in the second seal chamber 11b. The second seal chamber 11b includes a second evaporation portion 111b and a second condensation portion 112b communicating with the second evaporation portion 111b. The second heat dissipation structure 100b further includes a second connecting element 20b connected to the second evaporation portion 111b. The front-facing camera 201b is in contact with the second connecting element 20b. Heat generated by the front-facing camera 201b is transferred to the second connecting element 20b, and then is transferred to the second evaporation portion 111b. The heat transfer medium 12 in the second evaporation portion 111b absorbs heat and flows into the second condensation portion 112b to condense, and heat carried is dissipated out of the electronic device 200 via the second condensation portion 112b.

The electronic device 200 further includes a middle frame 202. The middle frame 202 is substantially rectangular. The middle frame 202 includes a plurality of side walls 2021 connected to each other to form the middle frame. An inner side of a side wall is concave and defines a receiving groove 2022. The condensation portion 112 of the seal chamber 11 protrudes out of the evaporation portion 111, and is received in the receiving groove 2022. The configuration of the condensation portion 112 protruding out of the evaporation portion 111 increases surface area of the condensation portion 112, which improves a heat dissipation rate of the heat transfer medium 12.

The side walls 2021 includes two first side walls 2021a parallel to each other and two second side walls 2021b parallel to each other. The first side walls 2021a and the second side walls 2021b connect to each other to form the middle frame. An inner side of the first side wall 2021a is concave and defines a first receiving groove 2022a. An inner side of the second side wall 2021b is concave and defines a second receiving groove 2022b. The first condensation portion 112a and the second condensation portion 112b are respectively received in the first receiving groove 2022a and the second receiving groove 2022b. In an alternative embodiment, the middle frame 202 can be any shape other than a rectangle, such as a circle.

One first heat conducting adhesive layer 30 is arranged between the rear-facing camera 201a and the first connecting element 20a, and another first heat conducting adhesive layer 30 is arranged between the front-facing camera 201b and the second connecting element 20b.

The first condensation portion 112a is fixed to a peripheral wall of the first receiving groove 2022a via one second heat conducting adhesive layer 40, and the second condensation portion 112b is fixed to a peripheral wall of the second receiving groove 2022b via another second heat conducting adhesive layer 40.

One side of the first condensation portion 112a of the first seal chamber 11a protrudes out of the first evaporation portion 111a, and two opposite sides of the second condensation portions 112b protrude out of the second evaporation portion 111b, thus the rear-facing camera 201a and the front-facing camera 201b can be mounted on appropriate positions.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An electronic device comprising:
   a middle frame comprising two first side walls parallel to each other and two second sidewalls parallel to each other, the two first side walls and the two second side walls connecting to each other to form the middle frame;
   a first heating element; and
   a first heat dissipation structure coupled to the first heating element, the first heat dissipation structure comprising:
   a first base body defining a first seal chamber, the first seal chamber comprising a first evaporation portion and a first condensation portion communicating with the first evaporation portion,
   a first heat transfer medium sealed in the first seal chamber, and
   a first connecting element coupled to the first evaporation portion and the first heating element;
   wherein heat generated by the first heating element is transferred to the first evaporation portion via the first connecting element, the first heat transfer medium in the first evaporation portion becomes gaseous as the first heat transfer medium absorbs heat, the gaseous first heat transfer medium flows into the first condensation portion and condenses to dissipate heat to an exterior of the electronic device;
   wherein an inner side of one of the two first side walls is concave and defines a first receiving groove, the first condensation portion is received in the first receiving groove;
   wherein the electronic device further comprises:
   a second heating element; and
   a second heat dissipation structure coupled to the second heating element, the second heat dissipation structure comprising:
   a second base body defining a second seal chamber, the second seal chamber comprising a second evaporation portion and a second condensation portion communicating with the second evaporation portion,
   a second heat transfer medium sealed in the second seal chamber, and
   a second connecting element coupled to the second evaporation portion and the second heating element;
   wherein heat generated by the second heating element is transferred to the second evaporation portion via the second connecting element, the second heat transfer medium in the second evaporation portion becomes gaseous as the second heat transfer medium absorbs heat, the gaseous second heat transfer medium flows into the second condensation portion and condenses to dissipate heat to the exterior of the electronic device;

wherein an inner side of one of the two second side walls is concave and defines a second receiving groove, the second condensation portion is received in the second receiving groove.

2. The electronic device of claim 1, wherein an end and a side of the first condensation portion protrude out of the first evaporation portion, opposite ends and a side of the second condensation portion protrude out of the second evaporation portion.

3. The electronic device of claim 1, wherein the first heating element is adhered to the first connecting element via one first heat conducting adhesive layer, the second heating element is adhered to the second connecting element via another first heat conducting adhesive layer.

4. The electronic device of claim 1, wherein the first condensation portion is adhered to a peripheral wall of the first receiving groove via one second conducting adhesive layer, the second condensation portion is adhered to a peripheral wall of the second receiving groove via another second conducting adhesive layer.

* * * * *